(12) United States Patent
Wu et al.

(10) Patent No.: US 11,947,395 B2
(45) Date of Patent: Apr. 2, 2024

(54) FOLDABLE DISPLAY DEVICE

(71) Applicant: InnoLux Corporation, Miao-Li County (TW)

(72) Inventors: Yuan-Lin Wu, Miao-Li County (TW); Yu-Chia Huang, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 211 days.

(21) Appl. No.: 17/081,977

(22) Filed: Oct. 27, 2020

(65) Prior Publication Data

US 2021/0157367 A1 May 27, 2021

(30) Foreign Application Priority Data

Nov. 22, 2019 (CN) .......................... 201911159194.9

(51) Int. Cl.
| | |
|---|---|
| *G06F 1/16* | (2006.01) |
| *B32B 7/022* | (2019.01) |
| *B32B 17/10* | (2006.01) |
| *B32B 27/30* | (2006.01) |
| *H10K 77/10* | (2023.01) |

(52) U.S. Cl.
CPC ............ *G06F 1/1652* (2013.01); *B32B 7/022* (2019.01); *B32B 17/10* (2013.01); *B32B 27/308* (2013.01); *H10K 77/111* (2023.02); *B32B 2255/26* (2013.01); *B32B 2457/20* (2013.01)

(58) Field of Classification Search
None
See application file for complete search history.

(56) References Cited

U.S. PATENT DOCUMENTS

| | | | |
|---|---|---|---|
| 10,003,044 B2* | 6/2018 | Nam | H01L 51/524 |
| 2015/0076458 A1* | 3/2015 | Lee | H10K 71/80 |
| | | | 438/23 |
| 2018/0356859 A1 | 12/2018 | Hamburgen | |
| 2018/0371196 A1* | 12/2018 | Park | C09J 5/06 |
| 2019/0036048 A1* | 1/2019 | Lee | H01L 51/0097 |
| 2019/0196538 A1 | 6/2019 | Kishimoto | |
| 2019/0204872 A1 | 7/2019 | Lee | |

FOREIGN PATENT DOCUMENTS

| | | |
|---|---|---|
| EP | 3 299 162 A1 | 3/2018 |
| WO | 2017/123899 A1 | 7/2017 |

\* cited by examiner

*Primary Examiner* — Anthony J Frost
(74) *Attorney, Agent, or Firm* — Winston Hsu

(57) ABSTRACT

A foldable display device is provided by the present disclosure. The foldable display device includes a foldable display panel and a foldable cover. The foldable cover is adhered to the foldable display panel. The foldable cover includes an inner substrate, an outer substrate and a first adhesive. The first adhesive is disposed between the inner substrate and the outer substrate. A thickness of the first adhesive is ranged from 1 micrometer to 40 micrometers, and a ratio of the sum of the thickness of the first adhesive and a thickness of the inner substrate to a thickness of the foldable cover is greater than or equal to 0.5 and less than 1. In addition, the foldable display device further includes a second adhesive disposed between the foldable display panel and the foldable cover.

10 Claims, 13 Drawing Sheets

FOLDABLE DISPLAY DEVICE

BACKGROUND OF THE DISCLOSURE

1. Field of the Disclosure

The present disclosure relates to a display device, more particularly to a foldable display device.

2. Description of the Prior Art

Foldable electronic device or deformable electronic device has become one of the topics in the new generation of electronic technology recently. Relatively, the demands of the foldable display device that can be integrated into the electronic device are increased accordingly, and the lifespan and/or the reliability of the foldable display device are also an important issue. Therefore, to achieve the desired product specifications such as deformable effect, life span, and display effect of the foldable display device through the design of the materials and/or the structures is the direction of development in the related field.

SUMMARY OF THE DISCLOSURE

One of the purposes of the present disclosure is to provide a foldable display device, wherein the related characteristics of the foldable display device may be improved through a foldable cover.

A foldable display device is provided by an embodiment of the present disclosure. The foldable display device includes a foldable display panel and a foldable cover. The foldable cover may be adhered to the foldable display panel. The foldable cover includes an inner substrate, an outer substrate and a first adhesive. The first adhesive is disposed between the inner substrate and the outer substrate. A thickness of the first adhesive is ranged from 1 micrometer to 40 micrometers, and a ratio of the sum of the thickness of the first adhesive and a thickness of the inner substrate to a thickness of the foldable cover is greater than or equal to 0.5 and less than 1.

A foldable display device is provided by another embodiment of the present disclosure. The foldable display device includes a foldable display panel, a foldable cover and a second adhesive. The foldable cover is disposed on the foldable display panel. The foldable cover includes an inner substrate, an outer substrate and a first adhesive. The first adhesive is disposed between the inner substrate and the outer substrate. The second adhesive is disposed between the foldable display panel and the foldable cover.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims of the present disclosure to refer to particular elements. As one skilled in the art will understand, the equipment manufacturers may refer to an element by different names. The present disclosure does not intend to distinguish between elements that differ in name but not function. In the following description and in the claims, the terms "include" and "comprise" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

The ordinal numbers used in the specification and the claims such as "first" and "second" are used to modify the element in the claims, which does not mean or represent that the requested element has any previous ordinal number, nor does it represent the order of one of the requested element and another one of the requested element or the order in the manufacturing method. The ordinal numbers are used only to discriminate a requested element having a certain name from another requested element with the same certain name.

It should be understood that although different technical features are respectively described in the embodiments listed in the following contents, the technical features can be mixed in different ways or recombined with each other without conflicting with each other.

Figure 1:
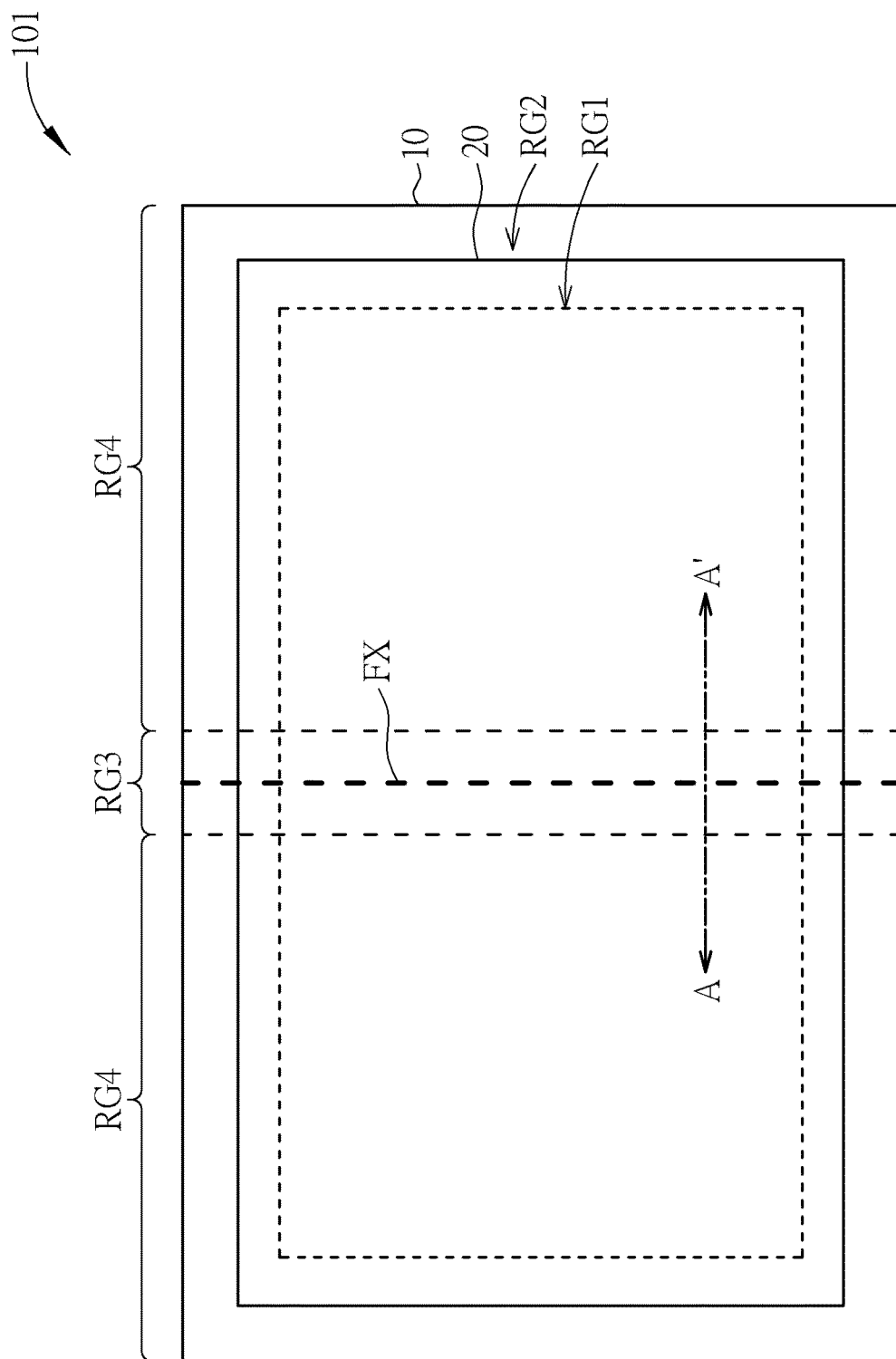
FIG. 1 schematically illustrates a top view of a display device according to a first embodiment of the present disclosure.
Figure 2:
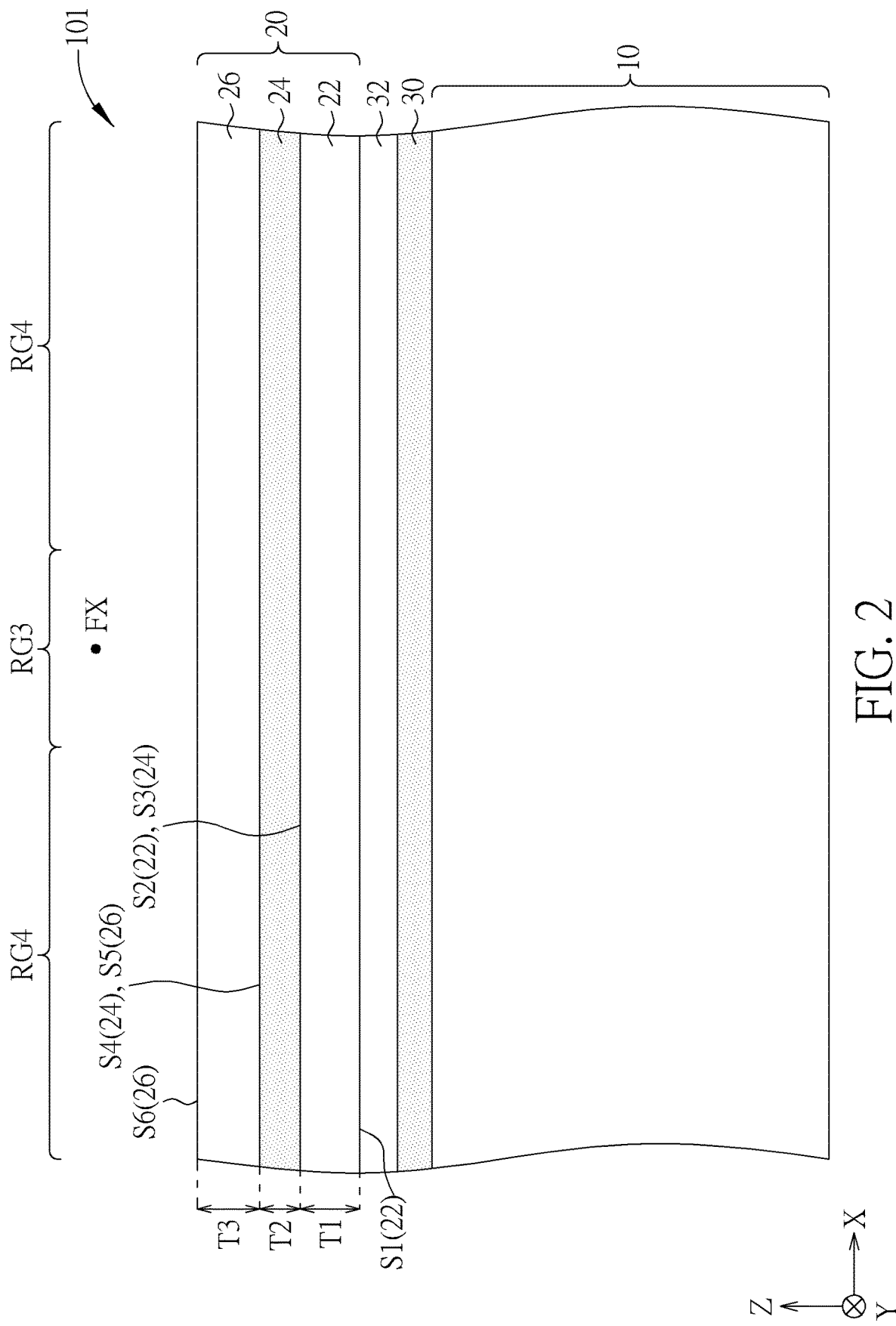
FIG. 2 schematically illustrates a partial cross-sectional view of the display device in a non-folded state according to the first embodiment of the present disclosure.
Figure 3:
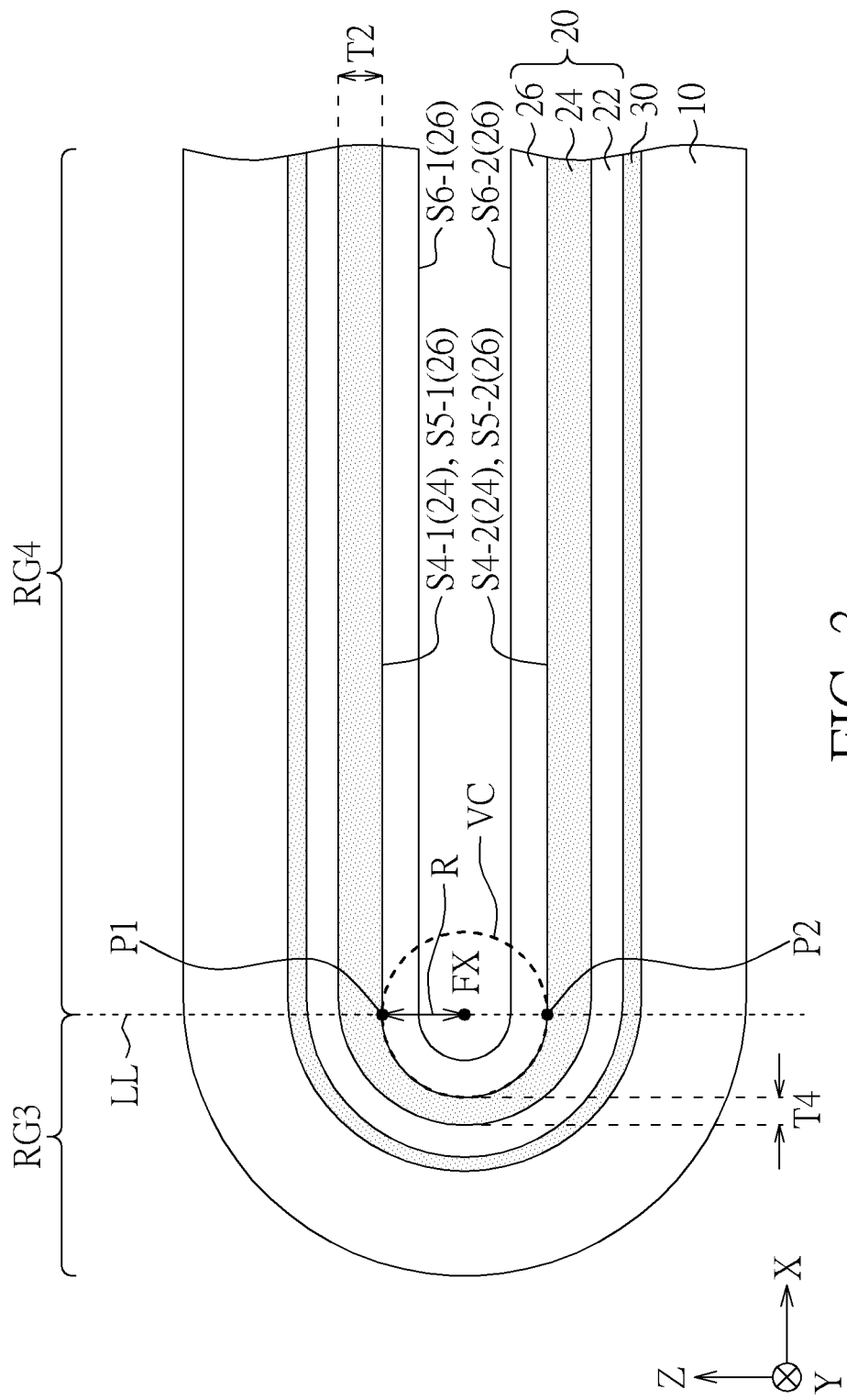
FIG. 3 schematically illustrates a partial cross-sectional view of the display device in a folded state according to the first embodiment of the present disclosure.

Referring to FIG. 1 to FIG. 3, FIG. 1 schematically illustrates a top view of a display device 101 according to a first embodiment of the present disclosure, FIG. 2 schematically illustrates a partial cross-sectional view of the display device 101 in a non-folded state, and FIG. 3 schematically illustrates a partial cross-sectional view of the display device 101 in a folded state. It should be noted that the cross-sectional view of the display device 101 shown in FIG. 2 may for example be drawn along a line A-A' shown in FIG. 1, but not limited thereto. As shown in FIG. 1 to FIG. 3, a display device 101 is provided by the present embodiment, wherein the display device 101 may include a display panel 10 and a cover structure 20. The display device (such as the above-mentioned display device 101 and the display devices in other embodiments) of the present disclosure may be regarded as a foldable display device, the display panel 10 may be regarded as a foldable display panel, and the cover structure 20 may be regarded as a foldable cover, but not limited thereto. The cover structure 20 may be disposed on the display panel 10. In some embodiments, the cover structure 20 may be adhered to the display panel 10, but not limited thereto. The cover structure 20 may include an inner substrate 22, an outer substrate 26 and a first adhesive 24 (such like an adhesive layer). In the present embodiment, the inner side may be regarded as a side relatively close to the center of the entire display device, and the outer side may be regarded as a side relatively far from the center of the entire display device, but not limited thereto. The first adhesive 24 may be disposed between the inner substrate 22 and the outer substrate 26. It is worth noted that the direction X may be orthogonal to the direction Y to form a virtual plane (not shown). In the condition that the display device 101 is not folded, the virtual plane is parallel to the surface of the display device 101, and the direction Z may be regarded as the normal direction of the plane formed of the direction X and the direction Y, but not limited thereto.

In some embodiments, the display device 101 may further include a second adhesive 30 (such like an adhesive layer) disposed between the display panel 10 and the cover structure 20, and the second adhesive 30 may be configured to adhere the inner substrate 22 to the display panel 10, but not limited thereto. The display device 101 includes a display region RG1 and a peripheral region RG2. In the display region RG1, as shown in FIG. 1, the display device 101 may further include the plurality of display elements LE, which, for example, emits a display light to implement a display function. In some embodiments, the peripheral region RG2 is adjacent to the display region RG1, and the display region RG1 may be the region of the dotted frame indicated by the arrow RG1 shown in FIG. 1, however, the shape of the display region RG1 of the present disclosure is not limited to the shape of the dotted frame, and may include various kinds of shapes according to the demands of the design. In some embodiments, the peripheral region RG2 may surround the display region RG1, and the peripheral region RG2 may be regarded as the portion outside the dotted frame of the above-mentioned display region RG1. In some embodiments, the projection area of the cover structure 20 in the direction Z may be greater than the display region RG1 of the display panel 10 to protect the display region. In other embodiments, the projection area of the cover structure 20 may be located in the peripheral region RG2, such that the cover structure 20 may be less likely to protrude from the display panel 10 when the display device 101 is being folded, but not limited thereto. In addition, the shape of the display device 101 in the top view is not limited to what is shown in FIG. 1, and may include other suitable shapes according to the demands of the design such as triangle, prism, trapezoid, wedge, other polygons or irregular shapes with curved edge, but not limited thereto.

In some embodiments, the display device 101 may include at least one foldable region RG3 extending along a direction (such as the direction Y), and the display device 101 may include at least two non-foldable regions RG4 located at two opposite sides of the foldable region RG3, but not limited thereto. In some embodiments, the display device 101 may include a plurality of foldable regions RG3 according to the demands of the design, and the plurality of non-foldable regions RG4 may be located between the foldable regions RG3. In addition, the display device 101 may be folded, curved, stretched, flexed and/or rolled along a folding axis FX. The folding axis FX may be overlapped with the foldable region RG3 in the direction Z, and the folding axis FX may extend along the direction parallel to the extending direction of the foldable region RG3, but not limited thereto. In addition, the display device 101 may be folded inward or outward according to the demands of the design. For example, when the folding axis FX is located at a side of the cover structure 20 far from the display panel 10 (for example, located above the top surface S6 of the outer surface 26), the display panel 101 may be folded inward along the folding axis FX (as shown in FIG. 3). Relatively, the folding axis FX may also be located at a side of the display panel 10 far from the cover structure 20, such that the display device 101 may be folded outward along the folding axis FX. In addition, the folding angle of the display device 101 may be adjusted according to the demands of the design. For example, in the non-foldable regions RG4, the top surfaces S6 (such as the top surface S6-1 and the top surface S6-2) of the outer substrate 26 at two opposite sides of the folding axis FX may be parallel to each other (as shown in FIG. 3) or an included angle may exist therebetween, and the bottom surfaces S5 (such as the bottom surface S5-1 and the bottom surface S5-2) of the outer substrate 26 at two opposite sides of the folding axis FX may be parallel to each other (as shown in FIG. 3) or an included angle may exist therebetween. In some embodiments, the folded state of the display device 101 may be that at least one of the layers of the display device 101 is folded such that the different portions of the surface of the layer may substantially be parallel to each other, for example, the top surface S4-1 and the top surface S4-2 of the first adhesive 24 in the non-foldable regions RG4 may be parallel to each other, as shown in FIG. 3. In such situation, a virtual circle VC may be shown, and the virtual circle VC may be tangent to the top surface S4-1 and the top surface S4-2 (for example, the virtual circle VC may be tangent to the top surface S4-1 and the top surface S4-2 through the point P1 and the point P2). A virtual line LL may pass through the points of tangency (such as the point P1 and the point P2) and the center of the virtual circle VC, and the radius of the virtual circle VC may be regarded as the radius of curvature R (for example, half of the distance between the point P1 and the point P2) of the first adhesive 24, but not limited thereto. In the present embodiment, the virtual line LL may be overlapped with the folding axis FX. It is worth noted that the above-mentioned method (forming a virtual circle which is tangent to the surface of a layer to obtain the radius of curvature of the layer) may be applied to other layers (such as the inner substrate 22) to obtain the radius of curvature of the other layers in the cover structure 20.

In some embodiments, the display panel 10 may include a self-emissive display panel, a non-self-emissive display panel or other suitable types of the display panels. The above-mentioned self-emissive display panel may include light emitting diodes (LED), but not limited thereto. The light emitting diode may for example include mini-LED, micro-LED, organic LED (OLED), quantum dot LED (QD-LED) or the combinations of the above-mentioned LEDs. The above-mentioned non-self-emissive display panel may include liquid crystal display element, electrophoresis display element, microelectromechanical systems (MEMS) display element, electronic ink display element or the combinations of the above-mentioned elements, but not limited thereto. In some embodiments, the display panel 10 may provide display function at a side of the display panel 10 facing the cover structure 20, but not limited thereto. In some embodiments, the display panel 10 may also provide display function at a side of the display panel 10 far from the cover structure 20. In other words, the display panel 10 may be a single-sided display panel, a double-sided display panel or a transparent display panel, but not limited thereto.

In some embodiments, the outer substrate 26 of the cover structure 20 may provide the required effects such as the optical requirements (such as the optical performance), the touch of use and/or the scratch resistance, the first adhesive 24 of the cover structure 20 may provide stress balance and the adhesion between the inner ring and the outer ring of the device when the device is being folded, and the inner substrate 22 of the cover structure 20 may serve as a buffer layer to against external force, so as to protect the display panel 10, but not limited thereto. In other words, the related characteristics (such as the folding effect, reliability and/or the life span of the product) of the foldable display device may be improved by the cover structure 20 formed of multiple layers of materials. In some embodiments, the Young's modulus of the outer substrate 26 may be greater than the Young's modulus of the inner substrate 22, but not limited thereto. For example, the Young's modulus of glass and sapphire glass may be greater than or equal to 71.7 GPa, and the Young's modulus of polyimide (PI), polyethylene naphthalate (PEN) and polycarbonate (PC) may be less than 10 GPa, but not limited thereto. 1 GPa is equal to $10^6$ Pa, and 1 Pa is equal to 1 newton per square meter (1 $N/m^2$).

In some embodiments, the materials of the inner substrate 22 and the outer substrate 26 may respectively include glass, rubber, polymer materials (such as polyimide, polyethylene naphthalate, polycarbonate, polyurethane, polydimethylenesiloxane and/or polyethylene terephthalate (PET)), at least one of the above-mentioned materials, the combinations of the above-mentioned materials or other suitable materials, and the material of the inner substrate 22 may be the same as the material of the outer substrate 26 or different from the material of the outer substrate 26. For example, the inner substrate 22 may include polyimide, and the outer substrate 26 may include glass in some embodiments, but not limited thereto. In some embodiments, the outer substrate 26 may include polymethylmetacrylate (PMMA). The outer substrate 26 may have anti-scratch and/or optical functions. The inner substrate 22 and the outer substrate 26 may be a single layer or a multi-layer structure formed of the above-mentioned materials, such as epoxy resin, acrylic resin (such as PMMA), benzocyclobutene (BCB), polyimide, polyester, and polydimethylsiloxane (PDMS), but the present embodiment is not limited thereto. When the inner substrate 22 and/or the outer substrate 26 include multi-layer structure, the layers may be formed by coating.

The first adhesive 24 may include optical clear adhesive (OCA), pressure sensitive adhesive (PSA) or other adhesive materials having suitable characteristics. In addition, the first adhesive 24 may be a transparent adhesive layer, and the material of the first adhesive 24 may include acrylate, urethane-based composition, acrylic-based composition, silicon-based composition or may be formed of other suitable adhesive materials. The first adhesive 24 may be a polymeric adhesive layer. In addition, the material of the second adhesive 30 may be similar to the material of the first adhesive 24, and the thickness and adhesive force of the second adhesive 30 may be adjusted to be the same as or different from the thickness and/or the adhesive force of the first adhesive 24 according to the demands of the design.

As shown in FIG. 2, in some embodiments, the first adhesive 24 may be configured to adhere the inner substrate 22 to the outer substrate 26, so the top surface S2 of the inner substrate 22 may directly be in contact with the bottom surface S3 of the first adhesive 24, and the bottom surface S5 of the outer substrate 26 may be directly in contact with the top surface S4 of the first adhesive 24. The inner substrate 22, the first adhesive 24 and the outer substrate 26 may respectively include a thickness T1, a thickness T2 and a thickness T3 in the direction Z. In some embodiments, the thickness T1 may be the distance from the bottom surface S1 of the inner substrate 22 to the top surface S2 of the inner substrate 22 in the direction Z under the condition that the display device 101 is not folded, the thickness T2 may be the distance from the bottom surface S3 of the first adhesive 24 to the top surface S4 of the first adhesive 24 in the direction Z under the condition that the display device 101 is not folded, and the thickness T3 may be the distance from the bottom surface S5 of the outer substrate 26 to the top surface S6 of the outer substrate 26 in the direction Z under the condition that the display device 101 is not folded. The position for measuring the thickness may be located in the non-foldable region RG4 and/or the region of the non-foldable region RG4 corresponding to the display region, and the measurement may be performed by measuring the value of a single point or obtaining the average of the values measured in multiple points, but not limited thereto.

In some embodiments, the related characteristics (such as folding effect, reliability and/or life span of the product) of the display device 101 may be improved by controlling the thickness conditions of the inner substrate 22, the first adhesive 24 and the outer substrate 26 respectively, but not limited thereto.

In some embodiments, the thickness T1 of the inner substrate 22 may be greater than the thickness T3 of the outer substrate 26. In some embodiments, the thickness T3 of the outer substrate 26 may be greater than the thickness T2 of the first adhesive 24, and a ratio (T3/T2) of the thickness T3 of the outer substrate 26 to the thickness T2 of the first adhesive 24 may be greater than 2 and less than or equal to 60, but not limited thereto. In some embodiments, the thickness T1 of the inner substrate 22 may be greater than the thickness T2 of the first adhesive 24, and a ratio (T1/T2) of the thickness T1 of the inner substrate 22 to the thickness T2 of the first adhesive 24 may be greater than 1 and less than or equal to 100, but not limited thereto. A ratio of the sum of the thickness T2 of the first adhesive 24 and the thickness T1 of the inner substrate 22 to the thickness of the cover structure 20 (such as the sum of the thickness T1, the thickness T2 and the thickness T3 mentioned above) may be greater than or equal to 0.5 and less than 1, but not limited thereto. In other words, in some embodiments, the thickness T1 of the inner substrate 22, the thickness T2 of the first adhesive 24 and the thickness T3 of the outer substrate 26 may meet the following equation (I), but not limited thereto.

$$0.5 \leq (T1+T2)/(T1+T2+T3) < 1 \qquad (I)$$

The following table 1 shows the result of the ball drop test of the inner substrate 22, the first adhesive 24 and the outer substrate 26 under different thickness combinations and under the condition that the inner substrate 22, the first adhesive 24 and the outer substrate 26 are not folded. The ball drop rest may be performed by using an object with a weight of about 8.5 grams to be dropped from 10 centimeters or higher from the top surface S6 of the outer substrate 26, thereby testing the ability of the cover structure 20 to withstand external stress (for example, to test whether the cover structure 20 may protect the display panel 10, such that the display panel 10 may not be broken by the external stress). In addition, in the ball drop test shown in table 1, the material of the outer substrate 26 may be glass, the material of the inner substrate 22 may be PET, and the adhesive force of the first adhesive 24 may be about 10 gf/in, but not limited thereto. As shown in FIG. 2 and table 1, the ratio of the sum of the thickness T2 of the first adhesive 24 and the thickness T1 of the inner substrate 22 to the thickness of the cover structure 20 (such as the sum of the thickness T1, the thickness T2 and the thickness T3 mentioned above) should be greater than or equal to 0.5 to pass the ball drop test. It is worth noted that the thickness and/or the adhesive force of the second adhesive 30 would not affect the result of the ball drop test mentioned above in some embodiments, so the adjustment of the thickness and/or the adhesive force of the second adhesive 30 according to other demands of the design is not considered. In other words, the effect of the thickness and/or the adhesive force of the second adhesive 30 may be neglected, and the main influencing factors may be the thickness T1 of the inner substrate 22, the thickness T2 of the first adhesive 24, the thickness T3 of the outer substrate 26 and the ratio relationship thereof.

embodiments, the measuring method of the thickness T4 mentioned above may include measuring the thickness of the first adhesive 24 in the foldable region RG3 under the folded state (the folded state may for example be that at least one of the layers of the display device 101 is folded such that the different portions of the surface of the layer may substantially be parallel to each other, for example, the top surface S4-1 and the top surface S4-2 of the first adhesive 24 in the non-foldable regions RG4 may be parallel to each other, as shown in FIG. 3), and the measurement of the thickness may be performed by measuring the value of a single point or obtaining the average of the values measured in multiple points, but not limited thereto.

The following table 3 shows the result of a folding test under the condition that the thicknesses of the inner substrate 22 and the outer substrate 26 are fixed, and the thickness of the first adhesive 24 is varied. The folding test may be performed by folding the display device 101 to the most extreme state under the condition that the radius of curvature R is about 1 millimeter (mm), and the folding action is repeated about 100000 times, thereby testing the reliability and life span of the cover structure 20. In addition, in the folding test shown in table 3, the material of the outer substrate 26 may be glass, the material of the inner substrate

TABLE 1

| combination | 1 | 2 | 3 | 4 | 5 | 6 | 7 | 8 |
|---|---|---|---|---|---|---|---|---|
| T3 (micrometer) | 40 | 40 | 40 | 40 | 40 | 40 | 40 | 40 |
| T2 (micrometer) | 0.1 | 1 | 5 | 5 | 15 | 15 | 10 | 40 |
| T1 (micrometer) | 10 | 10 | 10 | 20 | 25 | 50 | 60 | 60 |
| (T1 + T2)/(T1 + T2 + T3) | 0.20 | 0.22 | 0.27 | 0.38 | 0.50 | 0.62 | 0.64 | 0.71 |
| result | Fail | Fail | Fail | Fail | Passed | Passed | Passed | Passed |

The following table 2 shows the result of the ball drop test under the condition that the thicknesses of the inner substrate 22, the first adhesive 24 and the outer substrate 26 are fixed, and the material of the inner substrate 22 is varied, wherein the Young's modulus of the glass and the sapphire ($Al_2O_3$) glass used may be greater than or equal to 71.7 GPa, and the Young's modulus of the PI, PET and PC used may be less than 10 GPa, but not limited thereto. As shown in FIG. 2 and table 2, the Young's modulus of the inner substrate 22 should be less than 10 GPa to pass the ball drop test, and the Young's modulus of the outer substrate 26 may be greater than the Young's modulus of the inner substrate 22.

22 may be PET, and the adhesive force of the first adhesive 24 may be about 10 gf/in, but not limited thereto. As shown in FIG. 2, FIG. 3 and table 3, when the thickness T2 of the first adhesive 24 is too thin (for example, the thickness T2 is less than 1 micrometer), the thickness T4 of the first adhesive 24 in the foldable region RG3 may easily be insufficient during folding, such that the friction between the outer substrate 26 and the inner substrates 22 may be occurred, which leads to cracking of the outer substrate 26 and the inner substrates 22. When the first adhesive 24 is too thick (for example, the thickness T2 is greater than 20 micrometers), the relative misalignment between the outer substrate 26 and the inner substrate 22 may be too large to

TABLE 2

| combination | 9 | 10 | 11 | 12 | 13 |
|---|---|---|---|---|---|
| outer substrate (40 micrometers) | glass | glass | glass | glass | glass |
| first adhesive (10 micrometers) | materials with adhesive force of 10 gf/in | materials with adhesive force of 10 gf/in | materials with adhesive force of 10 gf/in | materials with adhesive force of 10 gf/in | materials with adhesive force of 10 gf/in |
| inner substrate (25 micrometers) | glass | sapphire glass | polyimide (PI) | polyethylene terephthalate (PET) | polycarbonate (PC) |
| result | Fail | Fail | passed | passed | passed |

Besides, it is worth noted that the thickness of the first adhesive 24 may be changed to provide stress balance when the display device 101 is being folded, so the thickness T4 of the first adhesive 24 in the foldable region RG3 may be less than the thickness T2 of the first adhesive 24 in the non-foldable region RG4, but not limited thereto. In some pass the test. Therefore, the thickness T2 of the first adhesive 24 should be greater than or equal to 1 micrometer and less than or equal to 40 micrometers to pass the folding test. It is worth noted that the thickness and/or the adhesive force of the second adhesive 30 does not affect the result of the folding test mentioned above in some embodiments, so the adjustment of the thickness and/or the adhesive force of the second adhesive 30 according to other demands of the design is not considered. In other words, the effect of the thickness and/or the adhesive force of the second adhesive 30 may be neglected, and the main influencing factors may be the thickness T1 of the inner substrate 22, the thickness T2 of the first adhesive 24, the thickness T3 of the outer substrate 26 and the ratio relationship thereof.

TABLE 3

| combination | 14 | 15 | 16 | 17 | 18 | 19 | 20 | 21 |
|---|---|---|---|---|---|---|---|---|
| T3 (micrometer) | 40 | 40 | 40 | 40 | 40 | 40 | 40 | 40 |
| T2 (micrometer) | 0.1 | 0.5 | 0.8 | 1 | 5 | 10 | 40 | 50 |
| T1 (micrometer) | 40 | 40 | 40 | 40 | 40 | 40 | 40 | 40 |
| result | Fail | Fail | Fail | passed | passed | passed | passed | Fail |

In some embodiments, the thickness T1 of the inner substrate 22 may range from 0.2 micrometer to 150 micrometers, the thickness T2 of the first adhesive 24 may range from 0.1 micrometer to 40 micrometers, and the thickness T3 of the outer substrate 26 may range from 20 micrometers to 100 micrometers, but not limited thereto. It should be noted that "the thickness T1 of the inner substrate 22 ranges from 0.2 micrometer to 150 micrometers" mentioned above represents that the thickness T1 is greater than or equal to 0.2 micrometer and less than or equal to 150 micrometers, and all of the terms "range from" in the present specification can be interpreted in the same way. In some embodiments, the thickness T1 of the inner substrate 22 may range from 20 micrometers to 100 micrometers, the thickness T2 of the first adhesive 24 may range from 1 micrometer to 40 micrometers, and the thickness T3 of the outer substrate 26 may range from 40 micrometers to 60 micrometers, but not limited thereto. In some embodiments, the thickness T1 of the inner substrate 22 may range from 30% to 55% of the thickness T5 of the cover structure 20 (for example, 30%≤T1/T5≤55%), the thickness T2 of the first adhesive 24 may range from 1.6% to 35% of the thickness T5 of the cover structure 20 (for example, 1.6%≤T2/T5≤35%), and the thickness T3 of the outer substrate 26 may range from 20% to 50% of the thickness T5 of the cover structure 20 (for example, 20%≤T3/T5≤50%), but not limited thereto. It is worth noted that the ranges of the thickness T1, the thickness T2 and the thickness T3 mentioned above may be applied to the inner substrate 22, the first adhesive 24 and the outer substrate 26 in the non-foldable region RG4 and/or the inner substrate 22, the first adhesive 24 and the outer substrate 26 in the foldable region RG3.

In addition, the adhesive force (AS) of the first adhesive 24 may range from 10 gram force per inch (gf/in) to 60 gf/in (for example, 10 gf/in≤AS≤60 gf/in). In some embodiments, the optical refractive indexes (for example, N=1.5) of the inner substrate 22, the first adhesive 24 and the outer substrate 26 may be similar to each other (for example, the refractive indexes are within a range±0.3, but not limited thereto), thereby reducing the negative effects (such as the scattering of light) of the cover structure 20 on the display, but not limited thereto.

As shown in FIG. 2, in some embodiments, the display device 101 may selectively include a release layer 32 disposed between the second adhesive 30 and the inner substrate 22, and in order to simplify the figure, the release layer 32 of the display device 101 in the folded state shown in FIG. 3 is omitted. In some embodiments, the release layer 32 may directly be in contact with the bottom surface S1 of the inner substrate 22, the release layer 32 may include hydrogen (for example, it may be a hydrogen-containing amorphous silicon layer or other hydrogen-containing material layer), and a laser annealing process may be used to cause a hydrogen explosion at the interface between the release layer 32 and the inner substrate 22, such that the cover structure 20 may be detached from the display panel 10, thereby reaching the effect of replacing the cover structure 20. Through the replacing method, the risk of damage due to tearing of the cover structure 20 by stress may be reduced. The laser annealing process mentioned above may be performed at a side above the display device 101, or may be performed at a side below the display device 101. In addition, a laser process may be selectively performed on local positions of the display device 101 to reduce the adverse effects on the electrical elements in the display panel 10, but not limited thereto.

It is worth noted that each of the features of the display device of the present disclosure may be applied to other kinds of electronic devices such as smart window, antenna, touch device, and etc. For example, the display layer of the display device may be replaced with a working medium layer, and the working medium layer may for example include liquid crystal of the liquid crystal antenna, liquid crystal of the liquid crystal window or other working mediums with specific functions.

Different embodiments of the present disclosure will be described in the following, and in order to simplify the description, the differences between each of the embodiments will be described in detail, and the repeated features will not be redundantly described. In addition, the label of the same elements in each of the embodiments of the present disclosure would be the same in order to facilitate the comparison between each of the embodiments. The features in each of the embodiments may be mixed or combined without departing from the spirit of the present disclosure or conflicting with each other.

Figure 4:
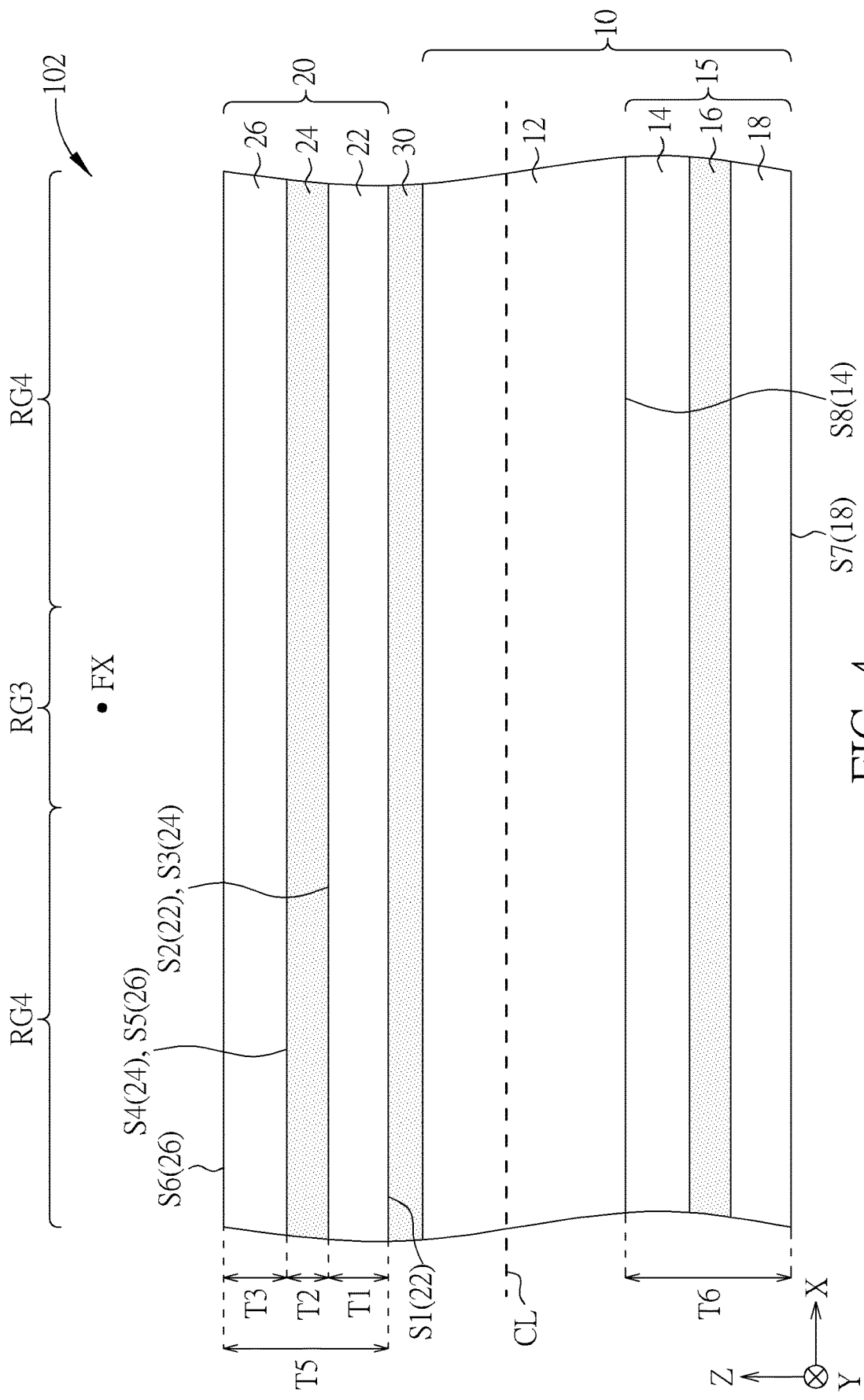
FIG. 4 schematically illustrates a partial cross-sectional view of a display device according to a second embodiment of the present disclosure.

Referring to FIG. 4, FIG. 4 schematically illustrates a partial cross-sectional view of a display device 102 according to a second embodiment of the present disclosure. As shown in FIG. 4, in some embodiments, the display panel 10 may include a display layer 12 and a flexible substrate 15, and the display layer 12 may be disposed between the flexible substrate 15 and the cover structure 20. The display layer 12 may include self-emissive display element, non-self-emissive display element or other suitable types of the display structures. The above-mentioned self-emissive display element may include light emitting diode, but not limited thereto. The light emitting diode may for example include mini light emitting diode, micro light emitting diode, organic light emitting diode, quantum dot light emitting diode or the combinations of the above-mentioned LEDs, but not limited thereto. The above-mentioned non-self-emissive display element may include liquid crystal display element, electrophoresis display element, microelectromechanical systems display element, electronic ink display element or the combinations of the above-mentioned elements, but not limited thereto.

The cover structure 20 and the flexible substrate 15 may respectively include a thickness T5 and a thickness T6 in the direction Z. In some embodiments, the thickness T5 may be equal to the sum of the thickness T1, the thickness T2 and the thickness T3 mentioned above, but not limited thereto. In some embodiments, the thickness T6 may be the distance from the bottom surface S7 of the flexible substrate 15 to the top surface S8 of the flexible substrate 15 in the direction Z under the condition that the display device 102 is not folded, and the measuring method of the thickness T6 may be similar to the measuring method of the thickness T1, the thickness T2 and the thickness T3 mentioned above, which will not be redundantly described here. In addition, the display device 102 may include a center line CL bended according to the folding condition, and the stress on the layers at two sides of the center line CL may be greater. In some embodiments, a ratio of the thickness T5 of the cover structure 20 to the thickness T6 of the flexible substrate 15 (T5/T6) may be greater than or equal to 0.8 and less than or equal to 1.2, such that the center line CL of the display device 102 may be located at the display layer 12, thereby reducing the possibility of damage of the display layer 12 caused by the stress when the display device 102 is being folded, but not limited thereto. In some embodiments, the center line CL may be regarded as the center line of the thickness of the entire display device 102 in the direction Z, but not limited thereto. In some embodiments, the center line CL may be a neutral plane of the display device 102, and may be regarded as the position where the compressive stress and the tensile stress are balanced, but not limited thereto.

In some embodiments, the flexible substrate 15 may include single layer material structure or multi-layers material structure. For example, the flexible substrate 15 may include a first substrate 14, a third adhesive 16 (such like an adhesive layer) and a second substrate 18, the third adhesive 16 may be disposed between the first substrate 14 and the second substrate 18, and the first substrate 14 may be disposed between the third adhesive 16 and the display layer 12. Therefore, the bottom surface S7 of the flexible substrate 15 may be the bottom surface of the second substrate 18, and the top surface S8 of the flexible substrate 15 may be the top surface of the first substrate 14, but not limited thereto. The materials of the first substrate 14 and the second substrate 18 may respectively include glass, rubber, polymeric materials such as PI, PEN, PC, polyurethane, polydimethylsiloxane and/or PET, at least one of the above-mentioned materials, the mixture of the above-mentioned materials or other suitable materials, and the material of the first substrate 14 and the material of the second substrate 18 may be the same or different. The material of the third adhesive 16 may be similar to the material of the first adhesive 24 mentioned above, but not limited thereto. When the display panel 10 is a single-sided display panel, the third adhesive 16 may include opaque adhesive materials. When the display panel 10 is a double-sided display panel or a transparent display panel, the third adhesive 16 may include transparent adhesive materials, but not limited thereto.

Figure 5:
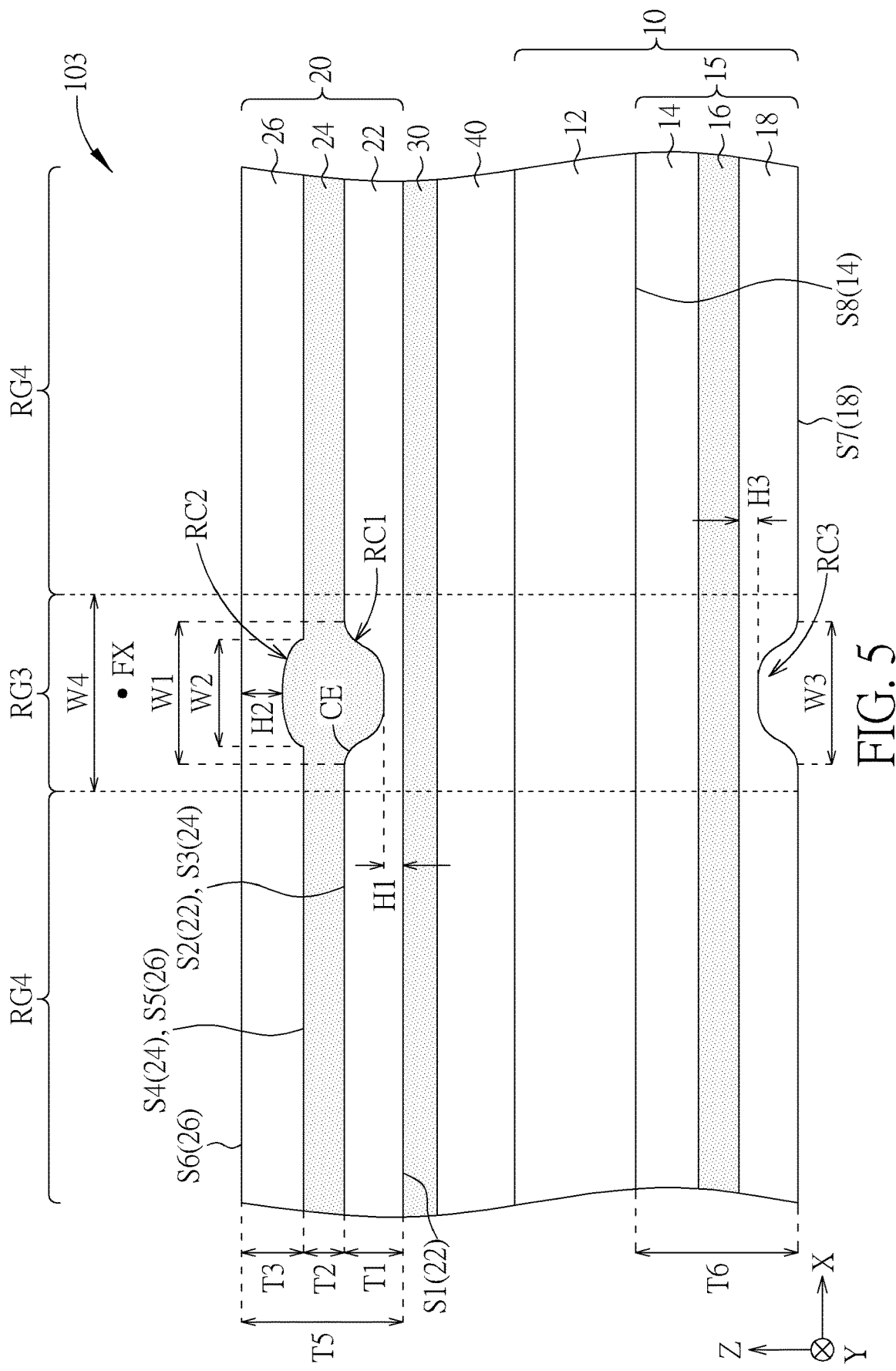
FIG. 5 schematically illustrates a partial cross-sectional view of a display device in a non-folded state according to a third embodiment of the present disclosure.

Referring to FIG. 5, FIG. 5 schematically illustrates a partial cross-sectional view of a display device 103 in a non-folded state according to a third embodiment of the present disclosure. In some embodiments, the cover structure 20 may include at least one first recess (such as the recess RC1 in the inner substrate 22 and/or the recess RC2 in the outer substrate 26) corresponding to the folding axis FX. That is, the recess RC1 and/or the recess RC2 may be overlapped with the folding axis in the direction Z. For example, the inner substrate 22 may include a recess RC1 corresponding to the folding axis FX, and the outer substrate 26 may include a recess RC2 corresponding to the folding axis FX, but not limited thereto. In some embodiments, only the recess RC1 is disposed in the inner substrate 22 or only the recess RC2 is disposed in the outer substrate 26 according to the demands of the design. The recess RC1 of the inner substrate 22 is the recess of the top surface S2 toward a direction approaching the display panel 10, and the recess RC2 of the outer substrate 26 is the recess of the bottom surface S5 toward a direction away from the display panel 10, so a portion of the first adhesive 24 may be disposed in the recess RC1 of the inner substrate 22 or in the recess RC2 of the outer substrate 26, but not limited thereto. In some embodiments, the thickness H1 of the recess RC1 and/or the thickness H2 of the recess RC2 may be less than 100 micrometers, for example, the thickness H1 may range from 50 micrometers to 80 micrometers, and the thickness T1 of the inner substrate 22 and/or the thickness T3 of the outer substrate 26 may range from 300 micrometers to 2000 micrometers, but not limited thereto. It is worth noted that the measuring method of the thickness of the above-mentioned recesses may include measuring the distance from the bottom surface of the recess to the corresponding surface, but not limited thereto. For example, the thickness H1 of the recess RC1 may be the distance from the bottom surface of the recess RC1 to the bottom surface S1 of the inner substrate 22, and the thickness H2 of the recess RC2 may be the distance from the bottom surface of the recess RC2 to the top surface S6 of the outer substrate 26, but not limited thereto. In addition, a ratio of the thickness H1 of the recess RC1 to the thickness T1 of the inner substrate 22 (such as H1/T1) may be greater than or equal to 0.02 and less than or equal to 0.2, and a ratio of the thickness H2 of the recess RC2 to the thickness T3 of the outer substrate 26 (H2/T3) may be greater than or equal to 0.02 and less than or equal to 0.2, but not limited thereto. It is worth noted that the range of the thickness T1 and the range of the thickness T3 mentioned above may be applied to the inner substrate 22 and the outer substrate 26 located in the non-foldable region RG4 in the present embodiment.

In addition, the first adhesive 24 may include a radius of curvature R under a folding condition, and the width W1 of the recess RC1 may meet the following equation (II), but not limited thereto.

$$0.8\pi R \leq W1 \leq 1.5\pi R \quad (II)$$

In addition, in some embodiments, the flexible substrate 15 may include a second recess (such as the recess RC3) corresponding to the folding axis FX of the cover structure 20, the recess RC3 may be the recess of the bottom surface (such as the bottom surface S7 of the second substrate 18) of the flexible substrate 15 toward a direction approaching the cover structure 20, but not limited thereto.

A ratio of the width (such as the width W1 of the recess RC1 and/or the width W2 of the recess RC2) of the recesses mentioned above to the width W3 of the recess RC3 (such as W1/W3 and/or W2/W3) may be greater than or equal to 0.7 and less than or equal to 1.3, but not limited thereto. In some embodiments, the width W1, the width W2 and/or the width W3 mentioned above may be less than the width W4 of the foldable region RG3 in the direction X under the condition that the foldable region RG3 is not folded (as shown in FIG. 5), but not limited thereto. In some embodiments, the width W1, the width W2 and/or the width W3 may be greater than or equal to the width of the foldable region RG3 in the direction X under the condition that the foldable region RG3 is not folded according to the demands of the design. It is worth noted that the measuring method of the width of the recesses mentioned above may include measuring the width of the recess from a starting point where the slope of the surface of the recess start changing (compared with the slope of a flat surface), but not limited thereto.

In some embodiments, the junction of the recess RC1 and the flat region of the inner substrate 22 may include arc-shaped edge CE, thereby reducing the possibility of damage caused by the friction between the inner substrate 22 and the outer substrate 26 when a folding is performed because the shape of the junction mentioned above is too sharp. In other embodiments, the junction of the recess RC2 and the flat region of the outer substrate 26 and/or the junction of the recess RC3 and the flat region of the flexible substrate 15 may also include arc-shaped edge, but not limited thereto. In addition, the recess RC1, the recess RC2 and/or the recess RC3 mentioned above may be overlapped with the folding axis FX in the direction Z, but not limited thereto. In some embodiments, the recess RC1, the recess RC2 and the recess RC3 may respectively extend along the direction Y (drawn in FIG. 1), and the recess RC1, the recess RC2 and the recess RC3 may respectively include linear patterns, folded patterns, block patterns or other suitable shapes. Through disposing the recess RC1, the recess RC2 and the recess RC3 and controlling the thickness and/or the width, the foldable property of the display device 103 may be improved without affecting the protecting effect of the non-foldable region RG4.

In some embodiments, the display device 103 may selectively include a functional layer 40 disposed on the flexible substrate 15, and the functional layer 40 may include single layer structure or multi-layers structure to provide specific functions, but not limited thereto. For example, the functional layer 40 may include touch sensing layer, polarizer, retardation layer (such as an optical retardation layer, wherein the optical retardation layer may include λ/2 retardation layer and/or λ/4 retardation layer), anti-reflection layer and/or other functional layers providing other functions. In some embodiments, the functional layer 40 may be disposed between the cover structure 20 and the foldable display panel 10. In some embodiments, the functional layer 40 may be disposed between the second adhesive 30 and the foldable display panel 10. In some embodiments, the functional layer 40 may be included in the cover structure 20 or may be regarded as at least a portion of any one of the substrate of the cover structure 20, but not limited thereto. In the present disclosure, the relative position of the functional layer 40 in the display device and/or the relative position of each of the layers in the functional layer 40 may be adjusted according to the demands of the design. It is worth noted that the functional layer 40, the recess RC1, the recess RC2 and/or the lower recess RC3 may be applied to other embodiments of the present disclosure according to the demands of the design.

Figure 6:
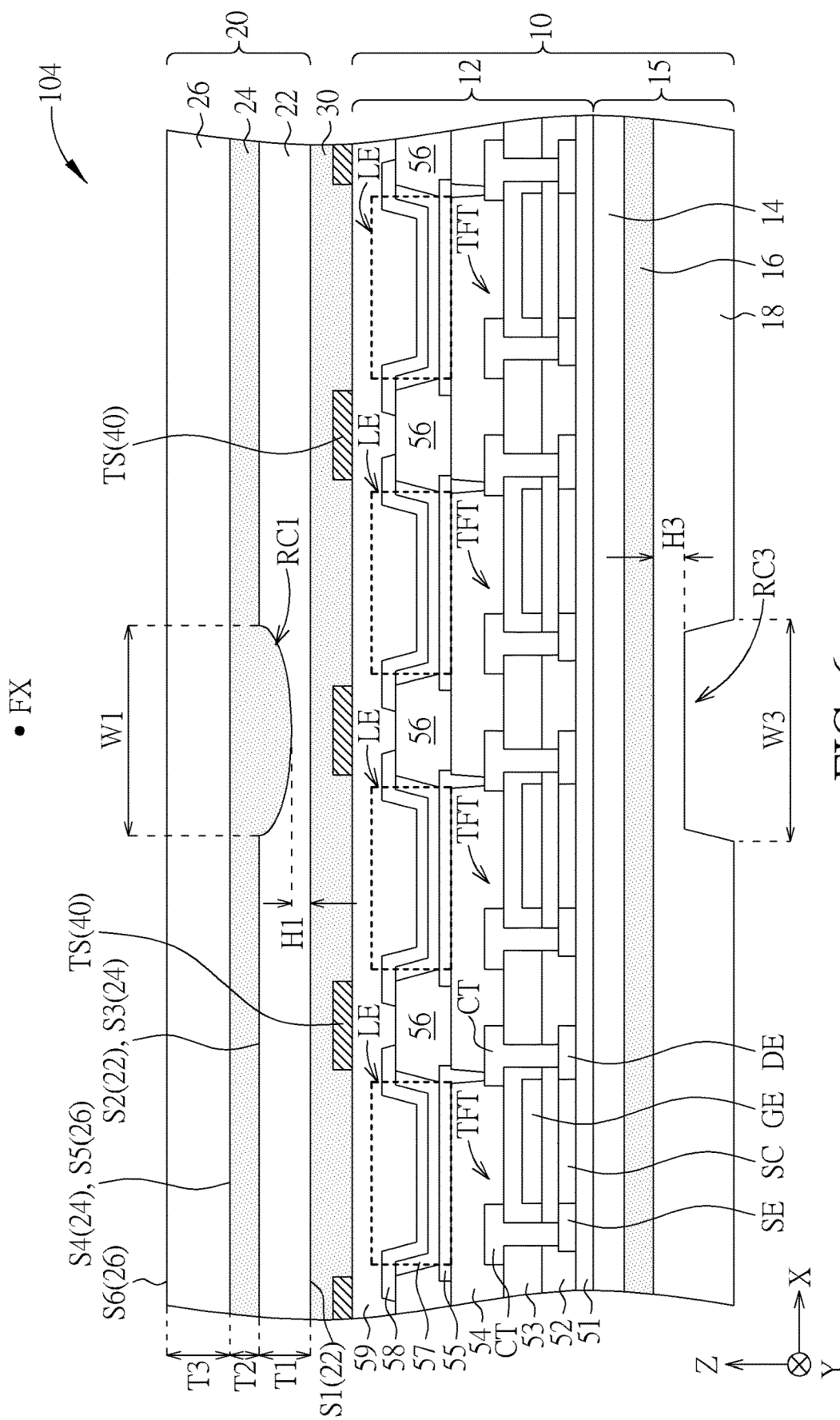
FIG. 6 schematically illustrates a partial cross-sectional view of a display device according to a fourth embodiment of the present disclosure.

Referring to FIG. 6, FIG. 6 schematically illustrates a partial cross-sectional view of a display device 104 according to a fourth embodiment of the present disclosure. As shown in FIG. 6, in some embodiments, the display layer 12 may include a dielectric layer 51, a dielectric layer 52, a plurality of control elements TFT, a dielectric layer 53, a planarization layer 54, a plurality of display elements LE, a pixel defining layer 56 and a dielectric layer 59. Each of the control elements TFT may include a semiconductor layer SC, a source electrode SE, a drain electrode DE, a gate electrode GE and/or a plurality of contact structures CT connected to the source electrode SE or the drain electrode DE respectively. The display layer 12 may further include a first electrode 55, a second electrode 58 and a light emitting layer 57 disposed between the first electrode 55 and the second electrode 58, and each of the display elements LE may include a portion of the first electrode 55, a portion of the second electrode 58 and a portion of the light emitting layer 57 disposed between the first electrode 55 and the second electrode 58. In some embodiments, the area of one of the display elements LE (such as the frame of the display element LE) may be defined by the bottom of the pixel defining layer 56, but not limited thereto. The dielectric layer 51 may be disposed on the first substrate 14, and the dielectric layer 51 on the first substrate 14 may be served as a buffer layer and provide buffer function, but not limited thereto. The dielectric layer 51 may include single layer dielectric material such as silicon oxide or silicon nitride, or the dielectric layer 51 may include multi-layers structure including different dielectric materials such as the multi-layers structure of silicon oxide and silicon nitride, but not limited thereto. The semiconductor layer SC may be disposed on the dielectric layer 51, and a portion of the semiconductor layer SC may be doped to form the source electrode SE and the drain electrode DE. That is, the source electrode SE and the drain electrode DE may be a portion of the semiconductor layer SC, but not limited thereto. In some embodiments, the semiconductor layer SC may include a polycrystalline semiconductor layer, a metal oxide semiconductor layer or other suitable semiconductor materials. The dielectric layer 52 may be disposed between the semiconductor layer SC and the gate electrode GE, and the dielectric layer 53 may be disposed on the dielectric layer 52 and the gate electrode GE. The contact structures CT may penetrate through the dielectric layer 53 and the dielectric layer 52, and may be directly electrically connected to the corresponding source electrode SE or drain electrode DE. The planarization layer 54 may be disposed on the dielectric layer 53 and the contact structures CT. The first electrode 55, the light emitting layer 57, the second electrode 58 and the pixel defining layer 56 may be disposed on the planarization layer 54, the light emitting layer 57 may be located in the opening formed by the pixel defining layer 56, and the dielectric layer 59 may be disposed on the display element LE and the pixel defining layer 56 to provide functions such as encapsulation and/or planarization, but not limited thereto.

The materials of the gate electrode GE, the contact structures CT, the first electrode 55 and the second electrode 58 mentioned above may include metal conductive materials (such as aluminum, molybdenum, copper, titanium, tungsten or other suitable conductive materials) or transparent conductive materials (such as indium tin oxide (ITO) or other suitable transparent conductive materials). The dielectric layer 52, the dielectric layer 53 and the dielectric layer 59 may include single layer structure or multi-layers structure including dielectric material (such as silicon oxide, silicon nitride, aluminum oxide or other suitable dielectric materials). In some embodiments, the gate electrode GE, the first electrode 55 and the second electrode may respectively include reflective electrode, transparent electrode or translucent electrode. The above-mentioned reflective electrode may include the electrode formed of silver, germanium, aluminum, copper, molybdenum, titanium, tin, aluminum neodymium alloy (AlNd), aluminum alloy (ACX), aluminum polymer (APC), etc. The above-mentioned transparent electrode may include transparent conducting oxide (TCO) electrode such as indium tin oxide electrode or indium zinc oxide electrode. The above-mentioned translucent electrode may include metal thin film electrode such as magnesium silver alloy thin film electrode, gold thin film electrode, platinum thin film electrode and/or aluminum thin film electrode, but not limited thereto. The materials of the planarization layer 54 and the pixel defining layer 56 may respectively include organic dielectric material (such as acrylic polymer material and/or silicone polymer material) or other suitable materials that can be photo-patterned, but not limited thereto. It is worth noted that the structures of the driving circuit and the display elements in the display layer 12 of the present disclosure are not limited to what is shown in FIG. 6, and may include other suitable types of driving circuits and/or display elements according to the demands of the design.

In addition, in some embodiments, the functional layer 40 may include a plurality of sensing elements TS disposed between the display layer 12 and the cover structure 20. In some embodiments, the plurality of sensing elements TS may be disposed at intervals and located between the plurality of display elements LE, but not limited thereto. The sensing elements TS may include touch sensing elements such as resistive type touch sensing element, self-capacitive type touch sensing element, mutual-capacitive type touch sensing element, optical type touch sensing element, force sensing type touch sensing element or other suitable types of touch sensing elements. In some embodiments, the sensing elements TS may also include antenna, image sensor, pressure sensor, temperature sensor and/or gas sensor, but not limited thereto. In other words, the sensing elements TS may provide one kind of sensing function or multiple kinds of sensing functions according to the demands of the design. It is worth noted that the sensing elements TS and/or the display layer 12 of the present embodiment may be applied to other embodiments of the present disclosure according to the demands of the design. In some embodiments, the shape of the recess RC3 may be different from the shape of the recess RC1 according to the demands of the design, for example, the recess RC3 may include a flat bottom surface and/or non-arc-shaped sidewalls, but not limited thereto. In some embodiments, the thickness H1 of the recess RC1, the thickness H2 of the recess RC2 and the thickness H3 of the recess RC3 may substantially be the same, but not limited thereto.

Figure 7A:
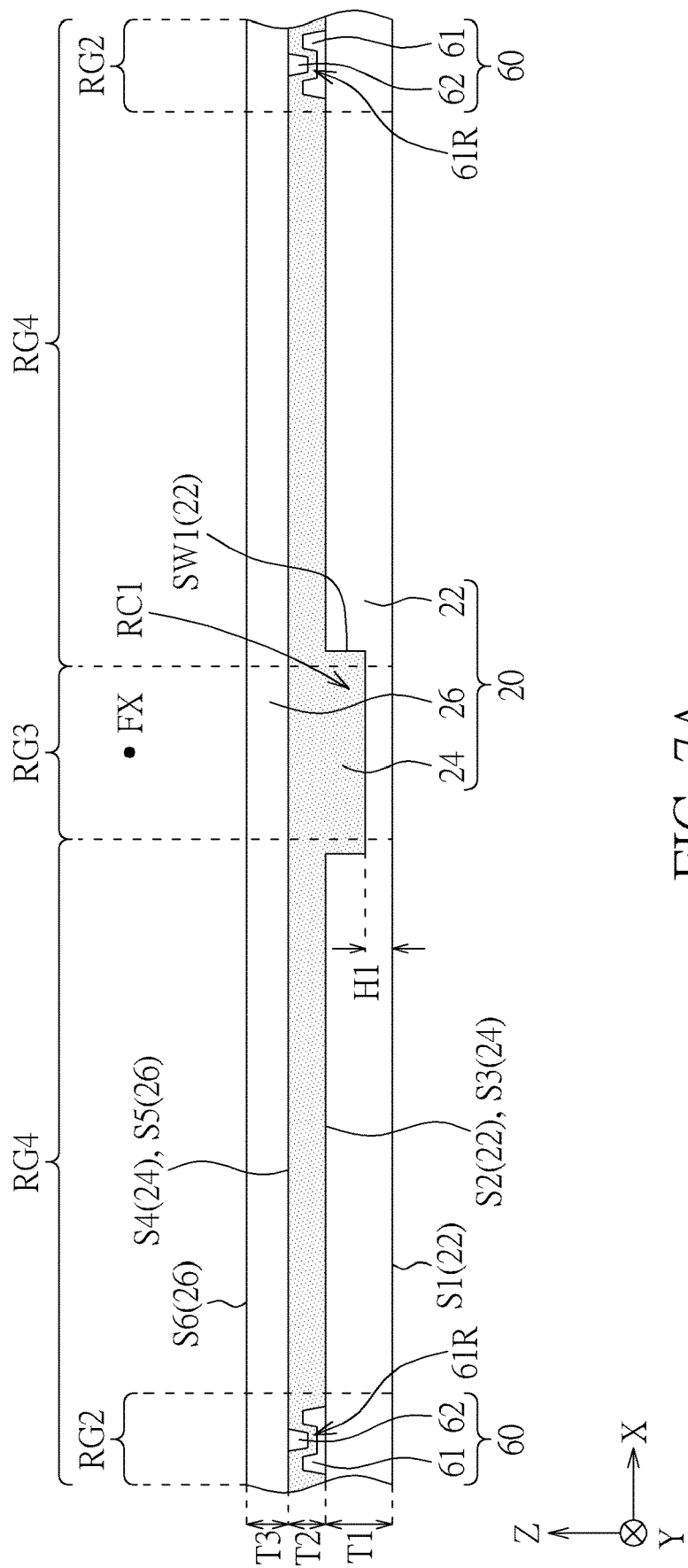
FIG. 7A schematically illustrates a cross-sectional view of a cover structure in a display device according to an embodiment of the present disclosure.

Referring to FIG. 7A to FIG. 7D, FIG. 7A to FIG. 7D schematically illustrate a cross-sectional view of a cover structure in a display device according to some embodiments of the present disclosure. In some embodiments, as shown in FIG. 7A, the cover structure 20 may further include a plurality of spacer structures 60 located in the peripheral region RG2 of the cover structure 20, and the spacer structures 60 may be disposed between the outer substrate 26 and the inner substrate 22. In addition, the spacer structure 60 may include at least one first spacer 61 and at least one second spacer 62 respectively disposed on the top surface S2 of the inner substrate 22 and on the bottom surface S5 of the outer substrate 26, such that the structural stability of the cover structure 20 may be improved by the spacer structures 60, and the risk of relative misalignment between the inner substrate 22 and the outer substrate 26 when the folding is performed may be reduced. The shape of the first spacer 61 and the second spacer 62 in the spacer structure 60 are narrow at the top and wide at the bottom, but not limited to what is shown in FIG. 7A, and may be adjusted according to the demands of the design. In some embodiments, the first spacer 61 may include a concave 61R corresponding to the second spacer 62, thereby achieving the effect of improving the structural stability. In some embodiments, the second spacer 62 may include a concave (not shown) corresponding to the first spacer 61 to achieve the similar effect, but not limited thereto. In addition, the sidewall SW1 of the recess RC1 may be perpendicular to the top surface S2 of the inner substrate 22 in some embodiments, but not limited thereto.

Figure 7B:
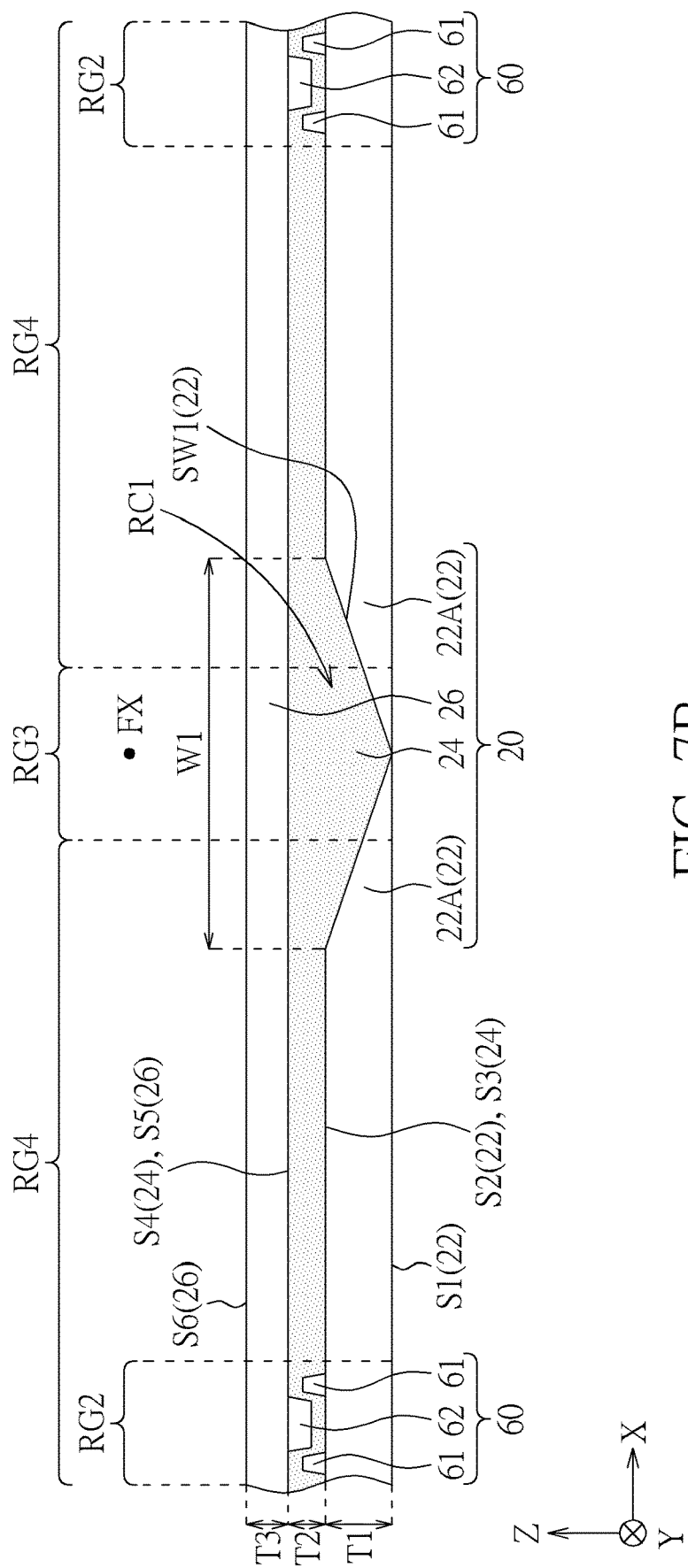
FIG. 7B schematically illustrates a cross-sectional view of a cover structure in a display device according to an embodiment of the present disclosure.

In some embodiments, as shown in FIG. 7B, the spacer structure 60 may include a plurality of first spacers 61, and the second spacers 62 may be partially located between two adjacent first spacers 61 in the direction X, thereby achieving the effect of improving structural stability. In some embodiments, the spacer structure 60 may include a plurality of second spacers 62, and the first spacers 61 may be partially located between two adjacent second spacers 62 in the direction X, but not limited thereto. In addition, the shape of the sidewall SW1 of the recess RC1 may be adjusted according to the demands of the design, the included angle between the sidewall SW1 of the recess RC1 and the bottom surface S1 of the inner substrate 22 may be greater than 0 degree and less than 90 degrees, or the sidewall of the recess RC1 may include arc-shaped edge, but not limited thereto. In addition, the recess RC1 may be located between the adjacent sub portions 22A, and the adjacent sub portions 22A may be connected to each other, so the recess RC1 may not expose the elements below the inner substrate 22.

Figure 7C:
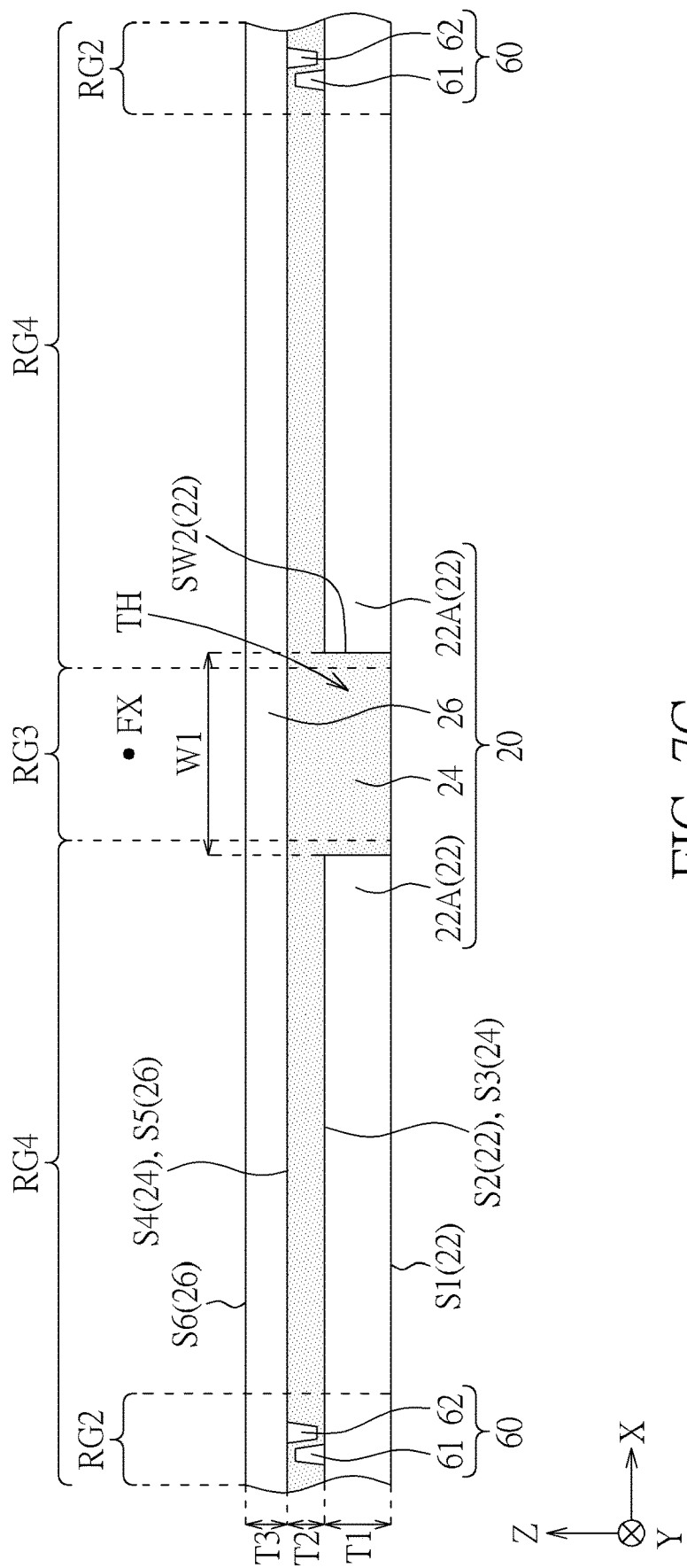
FIG. 7C schematically illustrates a cross-sectional view of a cover structure in a display device according to an embodiment of the present disclosure.

In some embodiments, as shown in FIG. 7C, a thorough hole TH may penetrate through the inner substrate 22 to divide the inner substrate 22 into at least two sub portions 22A, but not limited thereto. In some embodiments, the through hole TH may penetrate through the inner substrate 22 along the direction Z and expose the elements below the inner substrate 22. In some embodiments, the through hole TH may be overlapped with the folding axis FX in the direction Z, but not limited thereto. In some embodiments, the through hole TH may extend along the direction Y (the direction drawn in FIG. 1), but not limited thereto. The shape of the sidewall SW2 of the through hole TH may be adjusted according to the demands of the design, for example, the included angle between the sidewall SW2 of the through hole TH and the bottom surface S1 of the inner substrate 22 may be equal to 90 degrees, but not limited thereto. In the present embodiment, the through hole TH may be formed by the treatment (such as etching, laser or cutting) on the inner substrate 22. In some embodiments, the through hole TH may be formed by the combination (for example, the sub portions 22A are adhered at intervals) of the plurality of sub portions 22A of the inner substrate 22, but not limited thereto.

Figure 7D:
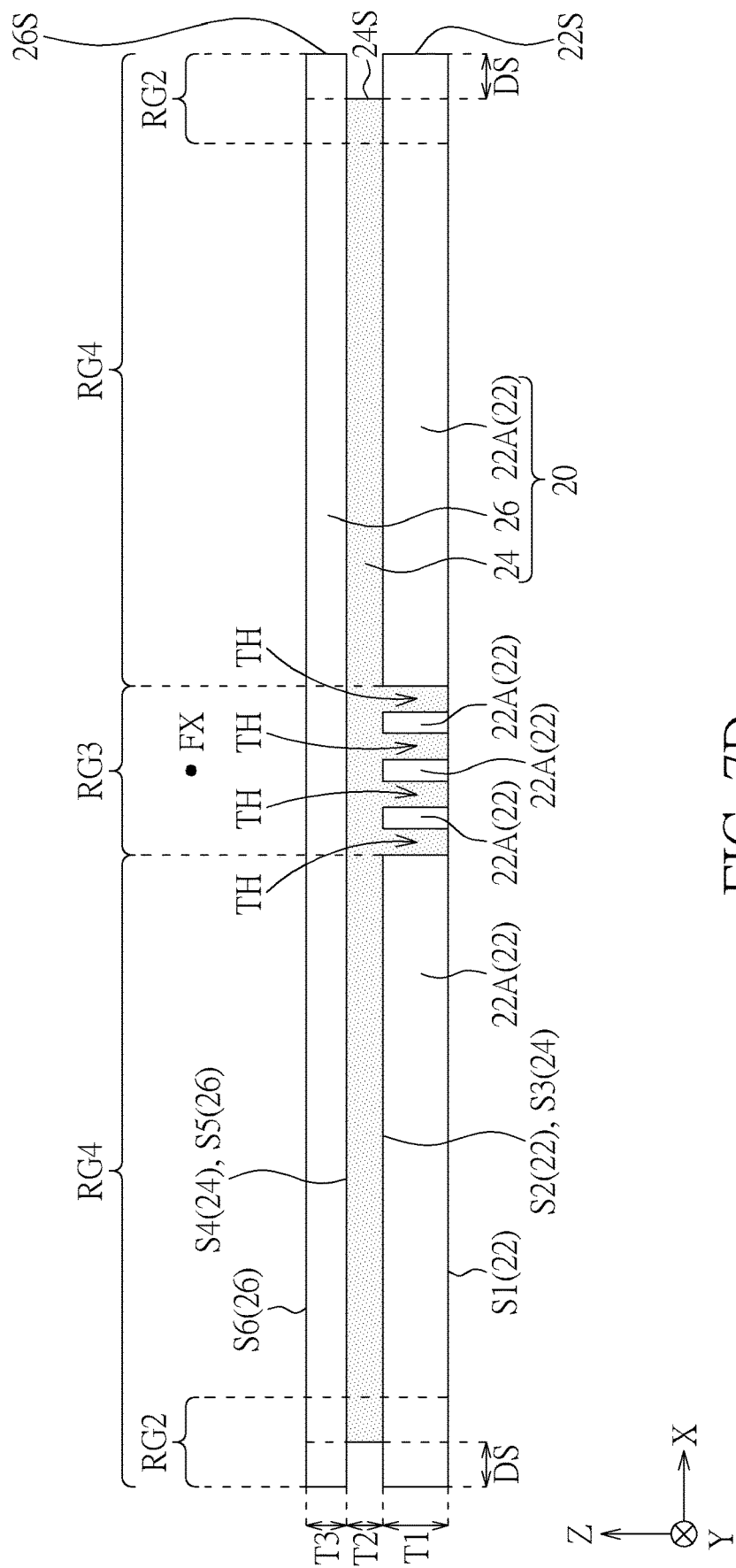
FIG. 7D schematically illustrates a cross-sectional view of a cover structure in a display device according to an embodiment of the present disclosure.

In some embodiments, as shown in FIG. 7D, the inner substrate 22 may include a plurality of through holes TH disposed in the foldable region RG3, and there are four through holes TH arranged at equal intervals in the present embodiment, but not limited thereto. A distance DS may be included between the edge 24S of the first adhesive 24 and the edge 22S of the inner substrate 22 and/or the edge 26S of the outer substrate 26 in the direction X under a non-folded condition to reserve an extending space of the first adhesive 24 when it is being folded. In some embodiments, the distance DS may be greater than or equal to 1 micrometer and less than or equal to 10 micrometers, but not limited thereto.

It is worth noted that the cover structure 20 of the present disclosure is not limited to what is shown in FIG. 7A to FIG.

7D, and the above-mentioned cover structure 20 shown in FIG. 7A to FIG. 7D may be applied to other embodiments of the present disclosure according to the demands of the design.

Figure 8:
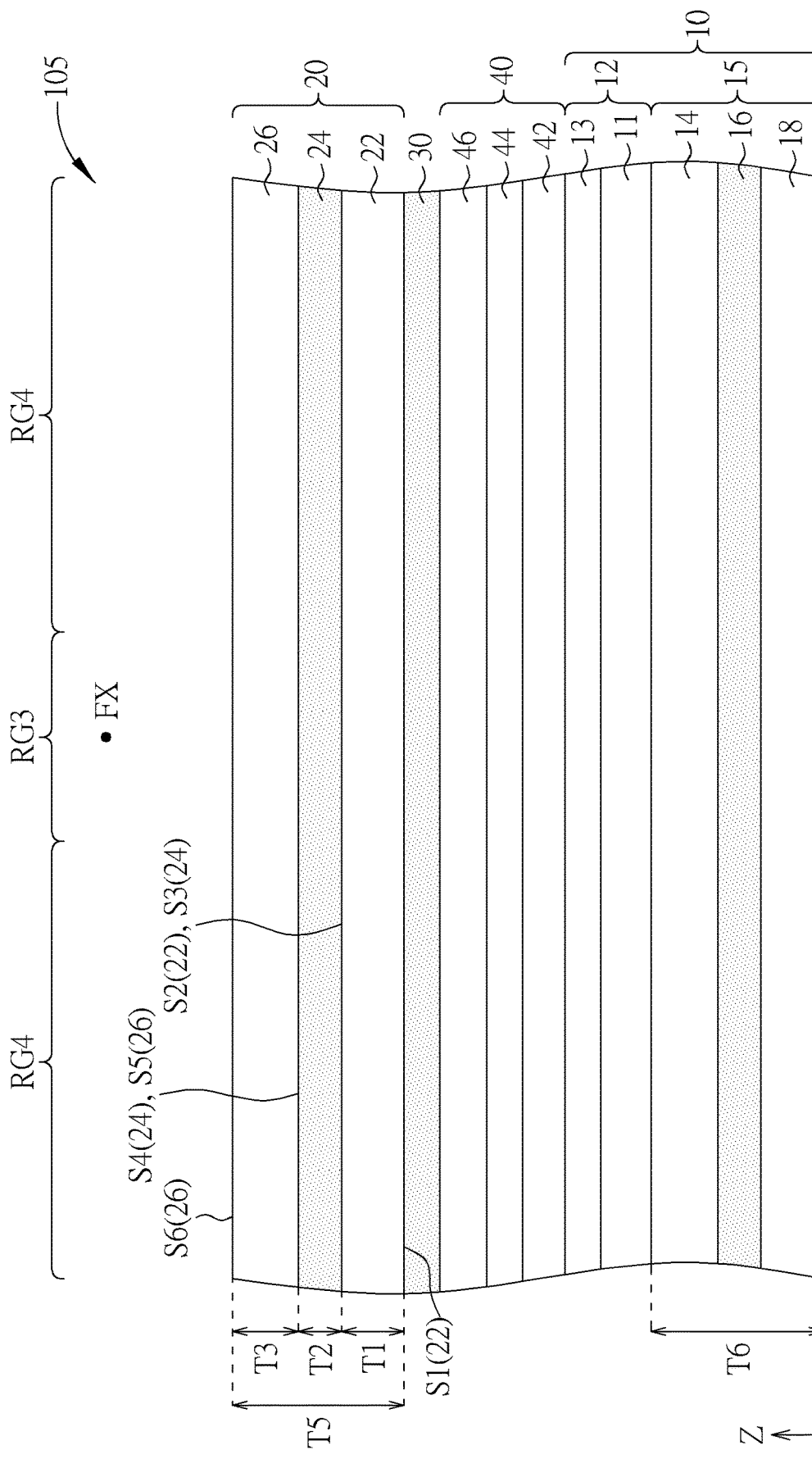
FIG. 8 schematically illustrates a partial cross-sectional view of a display device according to a fifth embodiment of the present disclosure.

Referring to FIG. 8, FIG. 8 schematically illustrates a partial cross-sectional view of a display device 105 according to a fifth embodiment of the present disclosure. As shown in FIG. 8, the functional layer 40 may include a sensing layer 42, a retardation layer 44 and a polarizer 46 disposed by stacking in the direction Z in some embodiments. The sensing layer 42 may include the sensing elements TS shown in FIG. 6 above and/or other suitable types of touch sensing elements, and the retardation layer 44 may include single layer or multi-layers of $\lambda/2$ retardation layer and/or $\lambda/4$ retardation layer, but not limited thereto. In addition, the relative position of each of the layers in the functional layer 40 may be adjusted according to the demands of the design, and is not limited to what is shown in FIG. 8. In some embodiments, the display layer 12 may include a driving circuit, a display element layer 11 (such as the control element TFT and the display element LE shown in FIG. 6 above) and an encapsulation layer 13 (such as the dielectric layer 59 shown in FIG. 6 above) disposed on the driving circuit and the display element layer 11, but not limited thereto. It is worth noted that the functional layer 40 and/or the display layer 12 of the present embodiment may be applied to other embodiments of the present disclosure according to the demands of the design.

Figure 9:
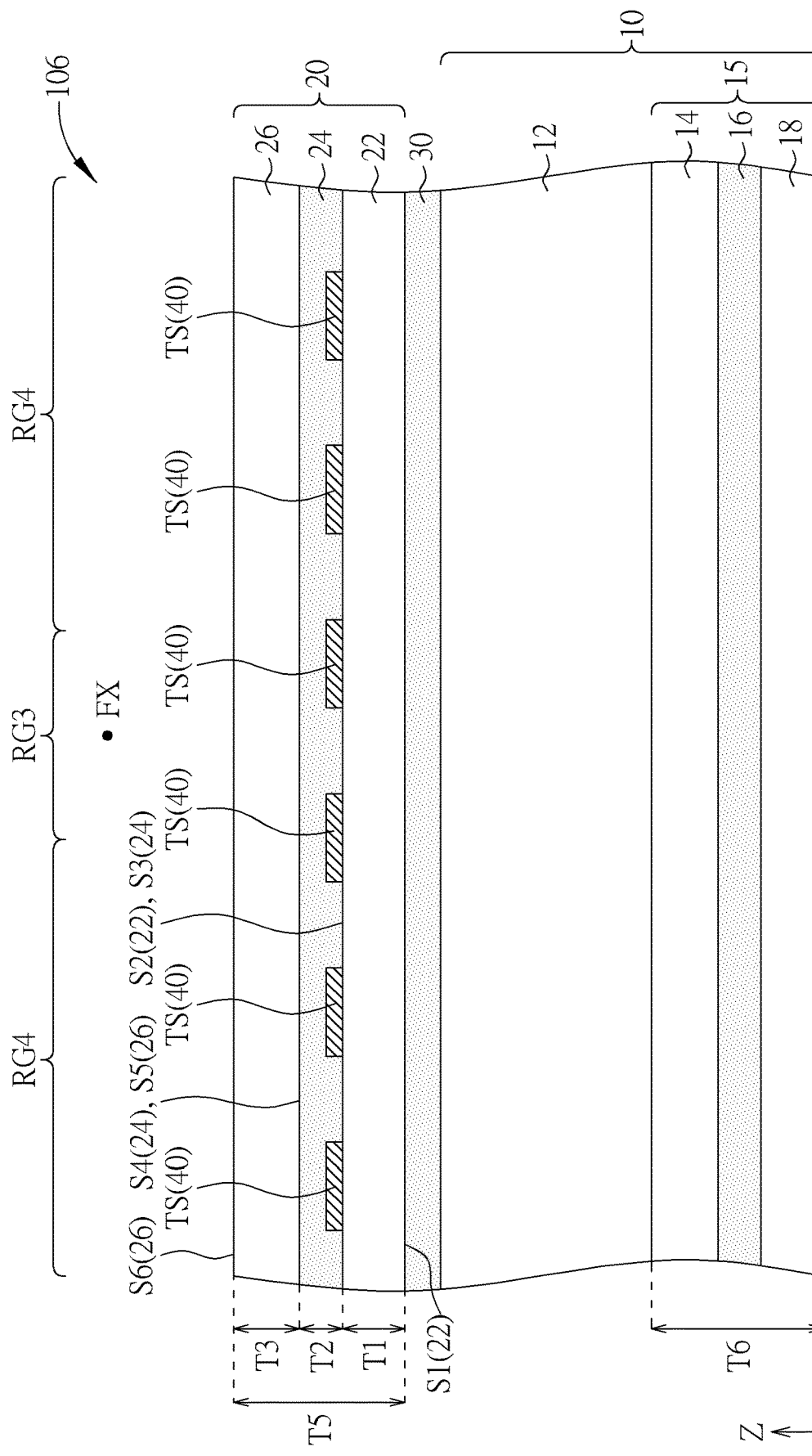
FIG. 9 schematically illustrates a partial cross-sectional view of a display device according to a sixth embodiment of the present disclosure.

Referring to FIG. 9, FIG. 9 schematically illustrates a partial cross-sectional view of a display device 106 according to a sixth embodiment of the present disclosure. As shown in FIG. 9, in some embodiments, the functional layer 40 may be at least partially disposed in the cover structure 20 or included in the cover structure 20, for example, the sensing elements TS in the functional layer 40 may be disposed in the cover structure, thereby achieving the effect of integrating the structure and/or reducing the total thickness, but not limited thereto. In some embodiments, a plurality of sensing elements TS may be disposed on the top surface S2 of the inner substrate 22, and the first adhesive 24 may cover the sensing elements TS and be partially located between the sensing elements TS and the outer substrate 26, but not limited thereto. In some embodiments, at least a portion of the sensing elements TS may be disposed on the bottom surface S5 of the outer substrate 26 according to the demands of the design, and the first adhesive 24 may cover the inner substrate 22 and be partially located between the sensing elements TS and the inner substrate 22, but not limited thereto. In the present disclosure, the shape and the disposed position in the cover structure 20 of the sensing elements TS are not limited to what is shown in FIG. 9, and may be adjusted according to the demands of the design. In addition, when the sensing elements TS includes opaque material (such as opaque metal), the sensing elements TS may not be overlapped with the display elements (such as the display elements LE shown in FIG. 6 above) of the display layer 12, and the effect of the sensing elements TS on the display effect may be reduced, but not limited thereto. It is worth noted that the sensing elements TS disposed in the cover structure 20 of the present embodiment may be applied to other embodiments of the present disclosure according to the demands of the design.

Figure 10:
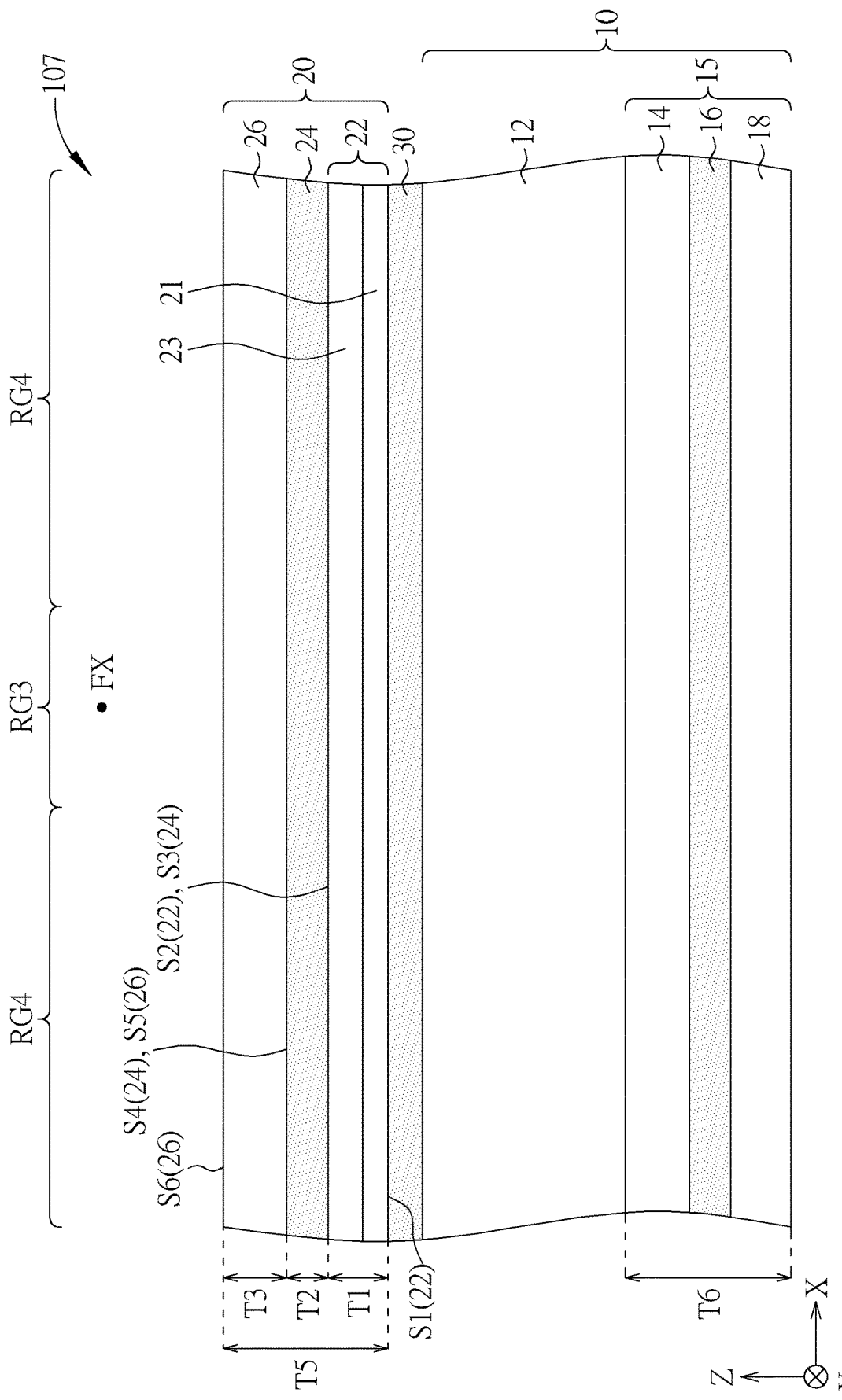
FIG. 10 schematically illustrates a partial cross-sectional view of a display device according to a seventh embodiment of the present disclosure.

Referring to FIG. 10, FIG. 10 schematically illustrates a partial cross-sectional view of a display device 107 according to a seventh embodiment of the present disclosure. As shown in FIG. 10, in some embodiments, the above-mentioned functional layer may be regarded as at least a portion of any one of the substrates in the cover structure 20, for example, the inner substrate 22 may include single layer or multi-layers of functional layer to achieve the effect of integrating the structure and/or reducing total thickness, but not limited thereto. For example, the inner substrate 22 may include a retardation layer 21 and a polarizer 23 disposed by stacking, and the retardation layer 21 may include $\lambda/2$ retardation layer and/or $\lambda/4$ retardation layer in some embodiments, but not limited thereto. In the present embodiment, the second adhesive 30 may be the thickest (for example the thickness of the second adhesive 30 may be greater than 30 micrometers, but not limited thereto) glue layer in the stacked layer above the display panel 10 and closest to the display panel 10, and the first adhesive 24 may be the thickest glue layer above the second adhesive 30. The inner substrate 22 may be the layer between the second adhesive 30 and the first adhesive 24 mentioned above. In some embodiments, the adhesion between the retardation layer 21 and the polarizer 23 may be performed through glue material (such as the glue with thickness less than 25 micrometers), heat pressing adhesion, bonding adhesion, static adhesion or other suitable adhesion methods. In addition, the inner substrate 22 may include other functional films (such as anti-reflection film) providing other effects in some embodiments. It is worth noted that the inner substrate 22 including functional films of the present embodiment may be applied to other embodiments of the present disclosure according to the demands of the design.

In summary, the cover structure formed of multiple layers of materials is used to improve related characteristics of the display device in the display device of the present disclosure. In addition, in some embodiments, the folding effect, reliability, lifespan and/or other related characteristics of the display device may be improved by respectively controlling the thickness of the inner substrate, the first adhesion layer and the outer substrate.

Although the embodiments and advantages of the present disclosure have been described above, it should be understood that anyone with ordinary knowledge in the art can make change, replacement, and modification without departing from the spirit and scope of the present disclosure. In addition, the scope of protection of the present disclosure is not limited to the processes, machines, manufacturing, material composition, devices, methods, and steps in the specific embodiments described in the specification. Anyone who has ordinary knowledge in the technical field can understand the processes, machines, manufacturing, material composition, devices, methods, and steps developed currently or in the future from the disclosed contents of the present disclosure, and these can be used according to the present invention as long as they can implement substantially the same functions or obtain substantially the same results in the embodiments described herein. Therefore, the protection scope of the present disclosure includes the above-mentioned processes, machines, manufacturing, material composition, devices, methods and steps. In addition, each of the claims constitutes an individual embodiment, and the scope of protection of the present disclosure also includes combinations of each of the claims and embodiments. The protection scope of the present disclosure shall be defined according to the appended claims in the following.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A foldable display device, comprising:
a foldable display panel;
a foldable cover adhered to the foldable display panel, the foldable cover comprising:
an inner substrate;
an outer substrate; and
a first adhesive disposed between the inner substrate and the outer substrate; and
a second adhesive disposed between the foldable display panel and the foldable cover, wherein the foldable display panel comprises a display layer and a flexible substrate, the display layer is disposed between the flexible substrate and the foldable cover, and the display layer comprises a self-emissive display element or a non-self-emissive display element,
wherein the flexible substrate comprises:
a first substrate;
a third adhesive; and
a second substrate, wherein the third adhesive is disposed between the first substrate and the second substrate, and the first substrate is disposed between the third adhesive and the display layer,
wherein a ratio of the sum of a thickness of the first adhesive and a thickness of the inner substrate to a thickness of the foldable cover is greater than or equal to 0.5 and less than 1, and a ratio of the thickness of the foldable cover to a thickness of the flexible substrate is greater than or equal to 0.8 and less than or equal to 1.2,
wherein a distance is between an edge of the first adhesive and an edge of the inner substrate under a non-folded condition.

2. The foldable display device of claim 1, wherein the thickness of the inner substrate is greater than a thickness of the outer substrate.

3. The foldable display device of claim 1, wherein a Young's modulus of the outer substrate is greater than a Young's modulus of the inner substrate.

4. The foldable display device of claim 1, wherein the inner substrate comprises a polymeric material.

5. The foldable display device of claim 1, wherein the inner substrate comprises polyimide and the outer substrate comprises glass.

6. The foldable display device of claim 1, wherein a thickness of the outer substrate is greater than the thickness of the first adhesive.

7. The foldable display device of claim 6, wherein a ratio of the thickness of the outer substrate to the thickness of the first adhesive is greater than 2 and less than or equal to 60.

8. The foldable display device of claim 1, wherein the thickness of the inner substrate is greater than the thickness of the first adhesive.

9. The foldable display device of claim 8, wherein a ratio of the thickness of the inner substrate to the thickness of the first adhesive is greater than 1 and less than or equal to 100.

10. The foldable display device of claim 1, wherein the thickness of the first adhesive is in a range from 1 micrometer to 40 micrometers.

* * * * *